(12) United States Patent
Ramiah et al.

(10) Patent No.: US 7,935,571 B2
(45) Date of Patent: May 3, 2011

(54) THROUGH SUBSTRATE VIAS FOR BACK-SIDE INTERCONNECTIONS ON VERY THIN SEMICONDUCTOR WAFERS

(75) Inventors: Chandrasekaram Ramiah, Phoenix, AZ (US); Douglas G. Mitchell, Tempe, AZ (US); Michael F. Petras, Phoenix, AZ (US); Paul W. Sanders, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 89 days.

(21) Appl. No.: 12/277,512

(22) Filed: Nov. 25, 2008

(65) Prior Publication Data

US 2010/0127394 A1 May 27, 2010

(51) Int. Cl.
*H01L 21/44* (2006.01)
(52) U.S. Cl. .. 438/108; 438/692; 438/738; 257/E21.584
(58) Field of Classification Search .................. 438/458, 438/618, 106–107, 33, 38, 113, 459, 977, 438/668, 637–640, 108, 633–634, 690–692, 438/738; 257/E21.584, E21.585, E21.577
See application file for complete search history.

(56) References Cited

U.S. PATENT DOCUMENTS

| | | | |
|---|---|---|---|
| 5,501,893 | A | 3/1996 | Laermer et al. |
| 6,790,748 | B2 | 9/2004 | Kim et al. |
| 6,800,930 | B2 | 10/2004 | Jackson et al. |
| 6,838,776 | B2 | 1/2005 | Leal et al. |
| 6,841,413 | B2 | 1/2005 | Liu et al. |
| 6,908,565 | B2 | 6/2005 | Kim et al. |
| 6,921,975 | B2 | 7/2005 | Leal et al. |
| 6,962,867 | B2 | 11/2005 | Jackson et al. |

(Continued)

FOREIGN PATENT DOCUMENTS

WO 2004111659 A2 12/2004

(Continued)

OTHER PUBLICATIONS

Hoshino, M, et al., Wafer Process and Issue of Through Eletrode in Si wafer using Cu Damascene for Three Dimensional Chip Stacking, 0-7803-7216- 6/02 IEEE 2002.

(Continued)

*Primary Examiner* — Tom Thomas
*Assistant Examiner* — Hoa B Trinh
(74) *Attorney, Agent, or Firm* — Ingrassia Fisher & Lorenz, P.C.

(57) ABSTRACT

Through substrate vias for back-side electrical and thermal interconnections on very thin semiconductor wafers without loss of wafer mechanical strength during manufacturing are provided by: forming (101) desired device regions (21) with contacts (22) on the front surface (19) of an initially relatively thick wafer (18'); etching (104) via cavities (29) partly through the wafer (18') in the desired locations; filling (105) the via cavities (29) with a conductive material (32) coupled to some device region contacts (22); mounting (106) the wafer (18') with its front side (35) facing a support structure (40); thinning (107) the wafer (18') from the back side (181) to expose internal ends (3210, 3220, 3230, 3240, etc.) of the conductive material filled vias (321, 322, 323, 324, etc.); applying (108) any desired back-side interconnect region (44) coupled to the exposed ends (3210, 3220, 3230, 3240, etc.) of the filled vias; removing (109) the support structure (40) and separating the individual device or IC assemblies (48) so as to be available for mounting (110) on a further circuit board, tape or larger circuit (50).

10 Claims, 3 Drawing Sheets

U.S. PATENT DOCUMENTS

| | | | |
|---|---|---|---|
| 6,972,480 | B2 | 12/2005 | Zilber et al. |
| 7,042,084 | B2 | 5/2006 | Takeuchi |
| 7,138,064 | B2 * | 11/2006 | Honda .............. 216/13 |
| 7,221,034 | B2 | 5/2007 | Ma et al. |
| 7,335,986 | B1 | 2/2008 | Paek et al. |
| 7,355,273 | B2 | 4/2008 | Jackson et al. |
| 7,432,196 | B2 * | 10/2008 | Tanida et al. .............. 438/667 |
| 2004/0118806 | A1 | 6/2004 | Kim et al. |
| 2004/0121556 | A1 | 6/2004 | Kim et al. |
| 2005/0214978 | A1 | 9/2005 | Taggart et al. |
| 2006/0252262 | A1 | 11/2006 | Kazemi |
| 2007/0158787 | A1 | 7/2007 | Chanchani |
| 2009/0079020 | A1 * | 3/2009 | Tanida et al. .............. 257/432 |

FOREIGN PATENT DOCUMENTS

| | | |
|---|---|---|
| WO | 2005004195 A2 | 1/2005 |
| WO | 2006124597 A2 | 11/2006 |
| WO | 2007106625 A2 | 9/2007 |

OTHER PUBLICATIONS

Puech, J, High Productivity DRIE solutions for 3D-SiP and MEMS Volume Manufacturing, Institute of Physics Publishing; Journal of Physics: Conference Series 34 (2006) 481-486.

Chambers, A.,et al., Si DRIE for Through-wafer via Fabrication, Retreived from the Internet: http://ap.pennnet.com/Articles/Article_Display.cfm?Section=ARCHI&ARTICLE_ID=249864&VERSION_NUM=2&p=36.

MEPTEC Report, vol. 11,No. 1, Quarter 1, 2007,5th Annual MEMS Symposium, Retrieved the the Internet, www.meptec.com.

Today's Package v. BBUL Pkg, Intel Labs.

Braunisch, H.,et al., Electrical Performance of Bumpless Build-Up Layer Packaging, Intel Corporation.

Towle, S., et al., Bumpless Build-Up Layer Packaging, Intel Corporation.

Intel Press Room Backgrounder- BBUL Packaging, Intel Corporation.

Katehi, L, et al., 3-D Integration of Rf Circuits Using Si Micromachining, 1527-3342 IEEE, Mar. 2001.

* cited by examiner

THROUGH SUBSTRATE VIAS FOR BACK-SIDE INTERCONNECTIONS ON VERY THIN SEMICONDUCTOR WAFERS

FIELD OF THE INVENTION

The present invention generally relates to semiconductor (SC) devices and integrated circuits (ICs) and their methods of manufacture, and more particularly, structures and methods for providing through-semiconductor-vias (TSVs) on very thin semiconductor wafers, die and/or ICs.

BACKGROUND OF THE INVENTION

A need continues to grow for more complex semiconductor (SC) based devices and circuits able to operate at higher and higher frequencies and handle increasing amounts of power and have lower unit cost. Many of these requirements create conflicting demands on the associated semiconductor device and integrated circuit (IC) design and manufacturing technology. For example, and not intended to be limiting, most SC devices and ICs are fabricated in and/or on substrate wafers, usually but not always single crystal SC wafers, which are then cut up ("singulated") into the individual devices or ICs. The manufacturing cost can be reduced by using larger and larger wafers, since more devices and ICs can be produced at the same time on larger wafers. However, to avoid undue wafer breakage, the wafer thickness must be increased as the wafer diameter is increased. With thicker wafers, the resulting IC or SC die thickness increases, and it becomes more difficult to remove heat from the devices or ICs. A further complication is the desire to be able to provide additional wiring on the SC die or IC and to include further interconnection layers and passive devices such as inductors, capacitors, and interconnections as a part of the SC die or IC. As used herein, the words "interconnection(s)", "interconnection layers" and "interconnect levels" and the like, singular or plural, are intended to couple different connection points on or above the SC surface and to include any type of passive components.

If only one surface of the SC die or IC is available for fabricating semiconductor devices and interconnections, the desired degree of complexity may not be achievable with present day structures and fabrication techniques. Further, as operating speed and power handling increase, the problems of efficient heat removal from the device die or IC become more and more difficult. Thus, there is a strong desire to be able to provide interconnections on the rear surface as well as the front surface of the devices or ICs, and to facilitate efficient heat transfer from the front surfaces where the active devices are typically located to the rear surface of the die or IC, without compromising mechanical robustness of the wafers during manufacture.

It is known to use conductor filled vias through the SC wafers as a means of providing electrical and thermal connections between the front and rear surfaces of the wafer and resulting individual device and IC die. These conductor filled vias are referred to as "through-substrate-vias" or "through-semiconductor-vias" and abbreviated as "TSV" (singular) or "TSVs" (plural). However, the desire to use larger diameter wafers for cost efficient manufacturing and at the same time provide highly conductive TSVs for electrically and thermally coupling the front and rear faces of the wafer substrate and resulting die are in conflict. The thicker the wafers, the more difficult it is to etch and fill the TSVs with conductors and the larger the amount of wafer area that must be devoted to such vias. Thus, thicker wafers mean larger TSVs and wasted device and IC surface area, thereby lowering the device and IC packing density on the wafer and increasing the cost of the resulting devices and ICs. Conversely, trying to use large diameter thin wafers so as to maintain the device area packing density reduces the mechanical stability of the wafers. It is well known that thin wafers break more easily, thereby reducing the manufacturing yield and increasing the cost of the resulting die and ICs. Thus, a need continues to exist for improved SC device and IC structures and fabrication techniques that facilitate providing minimal area TSVs for back-side interconnections and/or efficient heat removal without compromising mechanical stability of the wafers during manufacturing.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
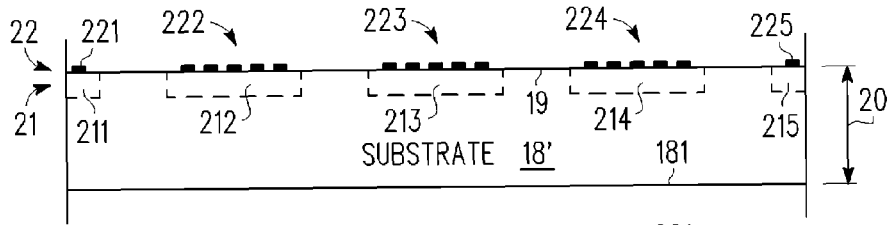
FIGS. 1-10 are simplified schematic cross-sectional views of a generalized SC device or IC wafer during various stages of manufacture, according to embodiments of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions or layers in the figures may be exaggerated relative to other elements or regions or layers to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or fabrication in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner.

As used herein, the term "semiconductor" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline and amorphous structures, thin film structures, layered structures as for example and not intended to be limiting semiconductor-on-insulator (SOI) structures, and combinations thereof. The term "semiconductor" is abbreviated as "SC." The terms "wafer" and "substrate", singular or plural, are intended refer to supporting structures that are relatively thin compared to their lateral surface area and used in connection with batch fabrication of electronic devices. Non-limiting examples of such wafers and substrates include: semiconductor wafers, SOI wafers, and other types of supporting structures in or on which active and/or passive electronic devices are fabricated or that are used in connection with the fabrication of such devices. The term "oxide" is intended to include any form of insulating dielectric whether organic or inorganic, and the term "metal" is intended to include any type of electrical conductor, whether organic or inorganic. Non-limiting examples of such conductors are doped semiconductors, semi-metals, alloys and mixtures, combinations thereof, and so forth.

For convenience of explanation and not intended to be limiting, semiconductor devices and methods of fabrication may be described herein for silicon semiconductors but persons of skill in the art will understand that other semiconductor materials can also be used.

FIGS. 1-10 are simplified schematic cross-sectional views of a generalized SC device or IC wafer during various stages 101-110 of manufacture, according to the present invention, showing structures 201-210 that result from each manufacturing stage 101-110. The convention is followed of identifying various common regions or dimensions that may change size and/or shape during the manufacturing process by the same reference numbers, wherein the initial regions or values are identified with a prime ('), as for example, regions or thicknesses 18', 30', d', etc., and the final regions or values are identified by the same reference number or letter, as for example, regions or thicknesses 18, 30, d, etc., with the prime (') omitted, it being understood that the reference number or letter with the prime (') identifies the initial region or value and the same reference number without the prime identifies the final region or value. Referring now to manufacturing stage 101, initial substrate 18' of, for example a semiconductor (SC), having upper surface 19, rear surface 181 and thickness 20 is provided having therein various device regions 211, 212, 213, 214, etc., collectively device regions 21. Thickness 20 (also referred to as "D") can be comparatively large even though TSVs will be provided in later manufacturing stages, since the problem of providing narrow, high aspect ratio vias in thick wafers is avoided by the present invention. The via aspect ratio (AR) is generally defined as the via length (or depth) divided by the via diameter (or width), i.e., via AR=d/w, where d is the via depth perpendicular to the SC surface and w is the via width (or diameter for a circular via). Vias may have any cross-sectional shape, for example, and not intended to be limiting, round, polygonal, rectangular (like a trench), etc. Substrate thickness 20 generally depends upon the diameter of initial substrate 18' the larger the diameter the greater the desired thickness 20 so as to preserve favorable mechanical stability during manufacturing. By way of example and not intended to be limiting, for silicon wafers of 200 mm diameter, thickness 20 can be in the range of about 650 to 750 micrometers and for silicon wafers of 300 mm diameter, thickness 20 can be in the range of about 735 to 815 micrometers, although other diameters and thicker and thinner wafers can also be used. Embodiments of the present invention allows the via width w and aspect ratio to be selected independent of the initial wafer thickness D, while at the same time preserving robust wafer mechanical stability during manufacturing and making it possible to obtain thin active device substrates when manufacturing is complete so that heat extraction and electrical coupling to the devices therein or both are facilitated.

The exact nature and number of the various devices formed in device regions 21 are not important to the present invention, and can include any type of active or passive device and associated interconnections. It is presumed that initial substrate 18' has on surface 19 various electrical contact regions 221, 222, 223, 224, 225, etc., collectively contacts 22, associated with device regions 21. In general, contacts 22 can be referred to as the "first level metallization" or "first level metal", and can include the electrical contacts to devices 21. Methods for forming such device regions and first level metallization are well known in the art and will depend upon the particular device types and IC functions desired by the designer. Structure 201 results.

Figure 2:
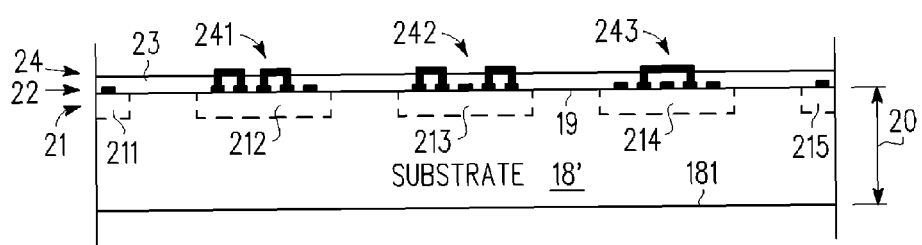
Figure 3:
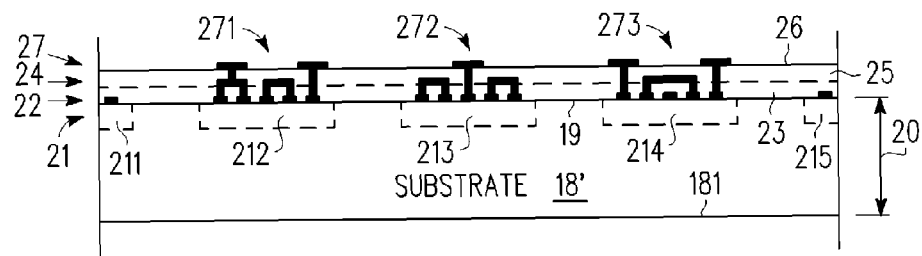

Manufacturing stages 102-103 of FIGS. 2-3, illustrate by way of example and not intended to be limiting, the formation of several layers of interconnections tying various first and second level metallization contact areas together and to other contacts. Methods for forming multiplayer metal interconnections are well known in the art and comprise, in general, superposing various dielectric and conductor layers that are patterned to implement the desired interconnections, including various passive devices if needed. Referring now to manufacturing stage 102 of FIG. 2, dielectric layer 23 is applied to surface 19 of initial substrate 18' and vias opened to those portions of first layer metal 22 desired to be contacted. These vias are then filled with second level metal portion 241 over device region 212, second level metal portion 242 over device region 213, second level metal portion 243 over device region 214, and so forth to provide desired second level metal interconnections 24. Second level metal portions 242, 242, 243, etc., are referred to collectively as second level metal 24 and the particular portions of first level metal 22 contacted by second level metal 24 shown in FIG. 2 are merely illustrative of what is accomplished generally and not intended to represent a particular circuit. Structure 202 results.

Referring now to manufacturing stage 103 of FIG. 3, dielectric layer 25 with upper surface 26 is desirably applied to form interlayer insulation between second level metal 24 and third level metal 27. Vias are opened to the underlying portions of second level metal 24 desired to be coupled via third level metal 27. These vias are filled, for example, with the third layer metal portions 271, 272, 273, etc., to provide the desired third layer metal interconnections, referred to collectively as third level metal 27. Persons of skill in the art will understand that various portions of third level metal 27 can be placed most anywhere above initial substrate 18' depending on the desired interconnections and any passive devices desired to be included. Thus, FIG. 3 is intended to be indicative of what can be accomplished and not to represent a particular circuit implementation. Structure 203 results. While FIGS. 2-3 illustrate formation of multiple interconnections levels, any number of metal layers (e.g., metal levels 1, 2, 3 . . . N) may be used depending upon the needs of the circuit or device designer. The structures of FIGS. 2 and 3 are intended merely as examples and not by way of limitation. While the present invention facilitates providing multiple layers of interconnections, different embodiments may use only a single metal layer or multiple dielectric and metal layers as desired by the circuit designer. In the manufacturing stages that follow, multi-layer structure 203 of FIG. 3 is assumed to be present, but this is not intended to be limiting and persons of skill in the art will understand based on the description herein, that structure 203 is illustrative of the use of any number (e.g., 1, 2, 3 . . . N) of metal layers, associated dielectric layers and other passive components as may be desired.

Figure 4:
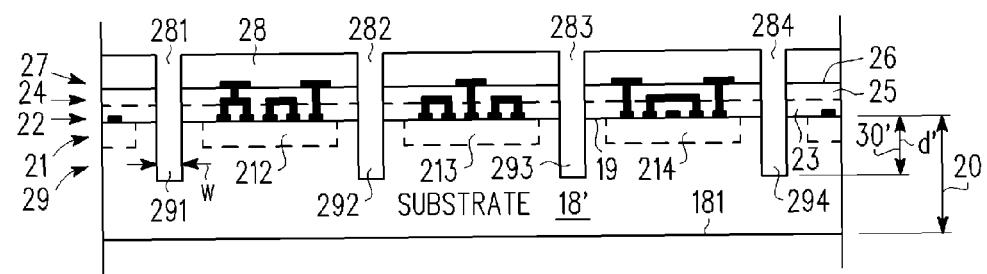

Referring now to manufacturing stage 104 of FIG. 4, in a preferred embodiment mask 28 is applied and patterned to provide openings 281, 282, 283, 284, etc. Photoresist is suitable for mask 28 but other well known mask materials (hard, soft and/or combinations thereof) may be used. Any number of openings 281, 282, 283, 284 . . . M may be provided depending upon the number and location of through substrate vias (TSVs) desired by the designer. Openings 281, 282, 283, 284 . . . M are desirably located in places that are free of underlying metal levels 22, 24, 27, etc., so that as dielectric layers 23, 25 for example and initial substrate 18' are etched through openings 281, 282, 283, 284 . . . M in mask 28, the desired interconnect levels are not interrupted. Cavities 291, 292, 293, 294, etc., (collectively 29) of width w and depth 30' (also referred to as depth d') from surface 19 are etched in initial substrate 18' under openings 281, 282, 283, 284 . . . M. Cavities 29 are desirably etched to depth 30' (depth d') from surface 19, less than substrate thickness 20. Cavities 29 can have high aspect ratios, that is, be slender compared to their depth (w<<d') even with thick wafers since it is not necessary to etch completely through initial substrate 18'. This allows the via diameter or width w to be selected so as to optimize the electrical and thermal conductivity of the vias independent of the initial wafer thickness D. For example, when using a silicon wafer as initial substrate 18' having initial thickness 20 of about D=700-1000 micrometers, via cavities 29 of width w~0.5 to 10 micrometers and depth d'~10 to 200 micrometers can be achieved using means well known in the art. With silicon substrates, cavity etching is preferably performed by deep reactive ion etching (DRIE) using, for example, the well known "Bosch" process (e.g., see U.S. Pat. No. 5,501,893), but other cavity formation methods may also be employed depending on the nature of initial substrate 18'. Laser drilling is a non-limiting example of another technique that can be used with various substrates. Laser drilling equipment such as that manufactured, for example, by XSiL Ltd, Silverstone House, Ballymoss Road, Sandyford, Dublin 18, Ireland is suitable. Structure 204 results, wherein narrow high aspect ratio via cavities 29 of depth 30' (depth d') have been formed in initial substrate 18'. Aspect ratios (AR=d/w or d'/w) in the range of 10 to 20 or higher are desirable. Since cavity depth d' is not constrained by the initial wafer thickness D, very small width w cavities can be provided. An advantage of being able to form narrow high aspect ratio cavities in initial substrate 18' is that they occupy much less substrate area than wide low aspect ratio cavities, so that many more vias can be provided within the same overall wafer or die area with less disruption of the circuit layout.

Figure 5:
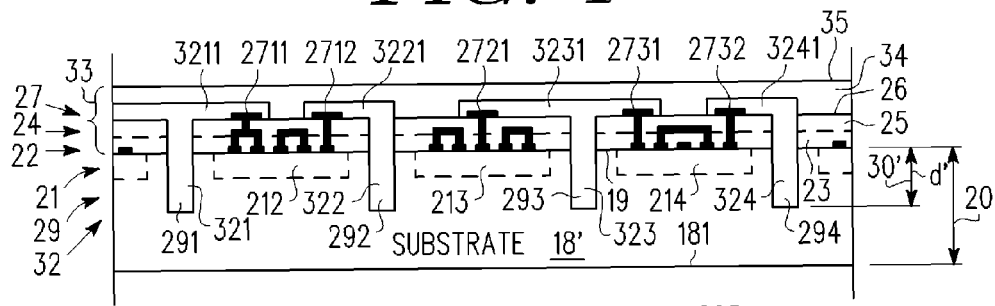

Referring now to manufacturing stage 105 of FIG. 5, mask 28 is removed using, for example a standard photo-resist strip, the exposed surface rinsed clean and regions 321, 322, 323, 324, etc., of conductive material (e.g., metal) 32 used to fill cavities 29 and contact any regions of third level metal 27 desired to be coupled to other conductors. By way of example and not intended to be limiting: (i) portion 3211 of conductive material (e.g., metal) 32 couples portion 2711 of third level metal 27 to conductive material region 321 in cavity 291; (ii) portion 3221 of conductive material 32 couples third level metal portion 2712 to conductive material region 322 in cavity 292; (iii) portion 3231 of conductive material 32 couples portions 2721 and 2731 of third level metal 27 to each other and to conductive material region 323 in via cavity 293; (iv) portion 3241 of conductive material 32 couples portion 2732 of third level metal 27 to conductive material region 324 in cavity 294, and so forth, depending upon the number of via cavities 29 that have been etched in initial substrate 18'. Passivation layer 34 having upper surface 35 is desirably provided over conductive material 32, but may be omitted in other embodiments. Interconnect region 33 refers to the combination of the various interconnect metal layers and associated dielectric layers, whether of only one metal level or multiple metal levels, and with or without passivation layer 34. Structure 205 results. In the manufacturing sequence illustrated by stages 101-105, various interconnect layers (or none) can be applied prior to etching of via cavities 29 in initial substrate 18' at any stage and not limited merely to stage 104. In the preferred embodiment, cavities 29 are etched in initial substrate 18' in step 104 prior to filling the cavities and providing conductive material 32 in step 105. However, in other embodiments, still further dielectric and metal levels may be applied to provide still further interconnects, including various passive devices if desired, after cavities 29 are etched and filled. Structure 205 results.

In some circumstances it is desirable prior to introducing conductive material 32 into cavities 29 to apply one or more thin liners (preferably of refractory materials) to cavities 29, as for example and not intended to be limiting, a dielectric liner if it is desired to have via conductive material 32 insulated from substrate 18', 18, and/or a barrier layer to prevent subsequent diffusion of conductive material 32 in via cavities 29 into substrate 18', 18, and/or an adhesion layer to promote adhesion of conductive material 32 to an underlying liner and/or substrate 18', 18. Silicon oxide, silicon nitride and combinations thereof are suitable insulating layers, but other well known dielectric materials can also be used. The insulating layer thickness should be chosen so as to withstand the largest voltage difference that would appear between conductive material 32 in via cavities 29 and substrate 18', 18. This will depend upon the particular circuit being implemented and is within the competence of those of skill in the art. Tantalum, titanium, Ti/TiN combinations and other refractory metals are suitable barrier and/or adhesion layers. Whether or not such barrier and/or adhesion layers are needed depends upon the semiconductor material of substrate 18', 18 and conductive material 32 in via cavities 29. For example and not intended to be limiting, when substrate 18', 18 comprises silicon and it is desired to use copper for conductive material 32, it is desirable to provide a Ta barrier layer of about 100 nanometers thickness, more or less in cavities 29, to prevent subsequent diffusion of copper from conductive material 32 in via cavities 29 into silicon substrate 18', 18 where it could adversely affect the properties of substrate 18', 18. Deposition of copper for conductive material 32 is preferably by electroplating. A sputtered initial seed layer may be desirable to facilitate plating. Deposition of, for example, tungsten for conductive material 32 in via cavities 29 is preferably accomplished by chemical vapor deposition (CVD). Tungsten provides a closer match to the coefficient of expansion of silicon than does copper, but either metal is useful, as are other semiconductor materials. A suitable barrier material for tungsten via metal is titanium and/or Ti/TiN combinations with thicknesses in the range of about 10 to 40 nanometers of Ti plus about 1 to 30 nanometers of Ti/TiN, but thicker and thinner layers can also be used depending upon the post deposition thermal environment to which the filled vias and substrate will be exposed. The choice of via metal depends on the material of substrate 18', 18, the number and location of vias, via size, and the tolerable via thermal and/or electrical resistance, depending on the design goals. For via cavities 29 of width w in the range of about 0.5 to 10 micrometers, as noted above, liner thicknesses in the range of about 100 nanometers or less are suitable. Persons of skill in the art will understand based on the description herein that such liners may be desirably included depending upon the materials and other choices made the designer. Since in general, liner thicknesses are a relatively small percentage (e.g., $\leq$1-20%) of via width w, such liners are not shown in FIGS. 5-10 to avoid unduly cluttering the drawings.

Figure 6:
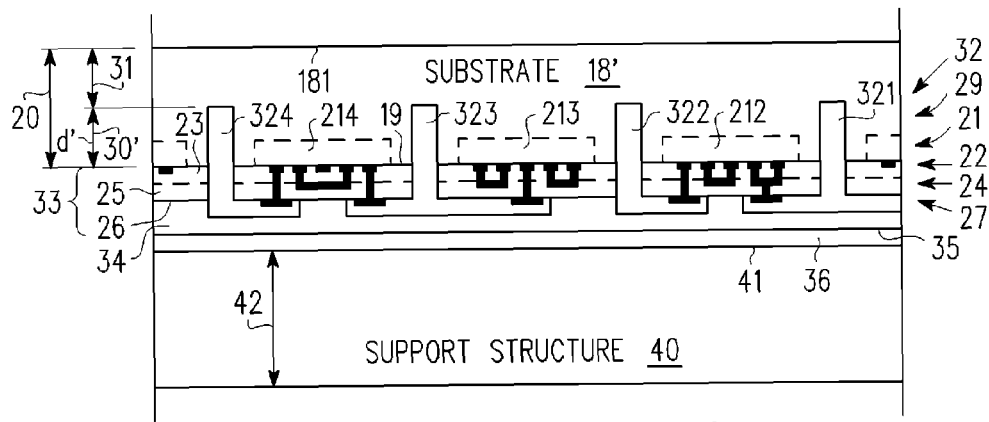

Referring now to manufacturing stage 106 of FIG. 6, the combination of initial substrate 18' and interconnect region 33 is flipped over and mounted on surface 41 of support structure 40, desirably by means of interface layer 36. Support structure 40 has thickness 42, chosen so as to provide robust support of initial substrate 18' and thinned substrate 18 (see FIG. 7) during subsequent manufacturing stages. Glass and/or other refractory materials with coefficients of expansion not grossly different than that of substrate 18', 18 are examples of suitable materials for support structure 40. The Electronic Markets Materials Division of 3M Company of St. Paul, Minn. provides suitable commercial tools and materials for bonding initial substrate 18' with interconnect region 33 to support structure 40 and is preferred, but other tools and techniques well known in the art (e.g., two-sided sticky-tape on glass, ceramic or SC substrates) may also be used. It will be noted that outer surface 35 of interconnect region 33 is bonded to support structure 40, so that interconnect region 33 and underlying device regions 21 are protected during further manufacturing stages. Also, thickness 42 of support structure 40 can be chosen independent of the geometry of via cavities 29, so as to provide the desired mechanical robustness to minimize wafer breakage during subsequent manufacturing steps. This is a significant advantage. Structure 206 results.

Figure 7:
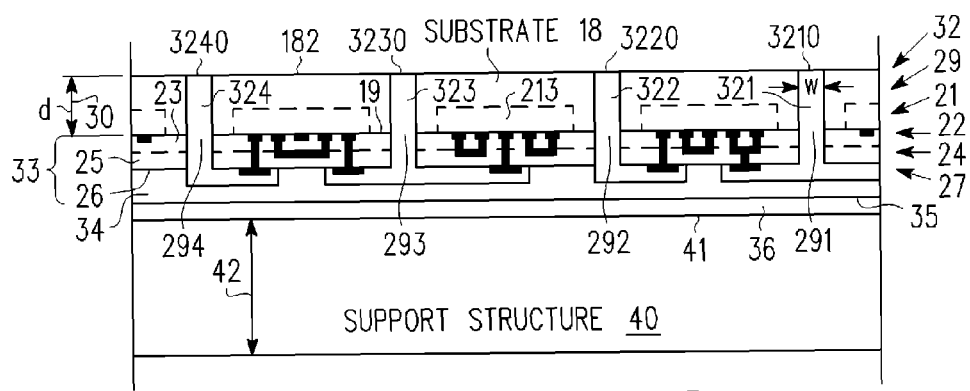

Referring now to manufacturing stage 107 of FIG. 7, portion 31 (see structure 206 of FIG. 6) of initial substrate 18' is removed, thereby leaving thickness 30 of thinned substrate 18 with surfaces 3240, 3230, 3220, 3210, etc., of regions 324, 323, 322, 321, etc., of conductive material (e.g., metal) 32 exposed on surface 182 of thinned substrate 18. Removal of portion 31 of initial substrate 18' is preferably accomplished by grinding followed by chemical-mechanical polishing (CMP), but other techniques well known in the art may also be used. Initial substrate 18' is supported during this thinning operation and resulting thinned substrate 18 is supported during subsequent manufacturing operations by robust support structure 40 so that the substrate thinning operation does not result in increasingly fragile wafers. Front face interconnect region 33 and device regions 21 are protected during this substrate thinning operation. Structure 207 results. Thickness 30 of final thinned substrate 18 and depth d of exposed conductive material filled vias 29 of FIG. 7 are generally close to thickness 30' and depth d' of initial substrate 18' and vias cavities 29 etched in initial substrate 18' of FIG. 6, differing by the amount of over-thinning used to expose conductive material 32 filling vias 29 if, for example, liners are used in via cavities 29. To a first order approximation, d~d'.

Figure 8:
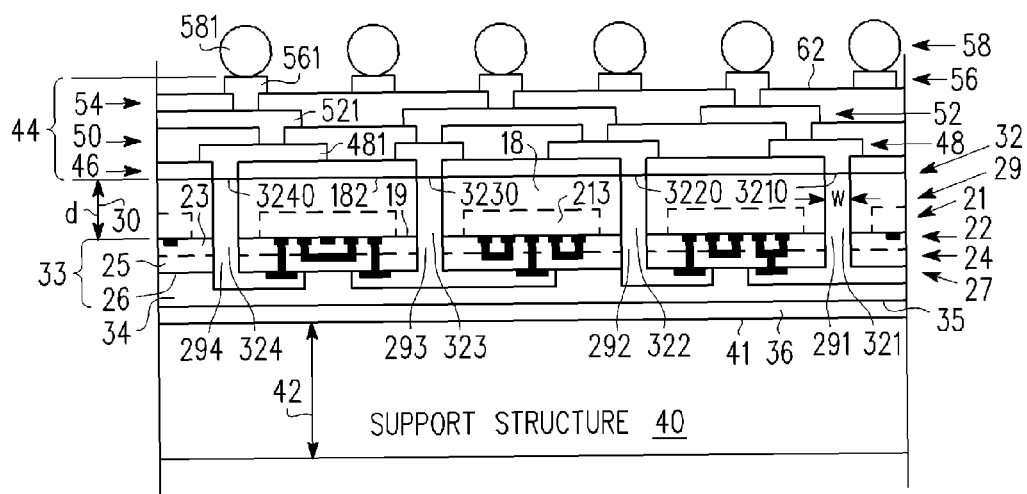

Referring now to manufacturing stage 108 of FIG. 8, interconnect region 44 is provided on surface 182 of thinned substrate 18. Similar to what was explained in connection with interconnect region 33, interconnect region 44 may comprise one or more dielectric and metal levels. In other embodiments, interconnect region 44 may be omitted and one or more of via conductor regions 3240, 3230, 3220, 3210, etc., on substrate surface 182 bonded to a heat sink or circuit board (not shown). By way of example and not intended to be limiting, FIG. 8 illustrates the situation, where multi-layer interconnections have been provided, so that interconnect region 44 comprises for example, first dielectric layer 46 with openings extending to exposed portions 3240, 3230, 3220, 3210, etc., of via conductive material 32, first metal level 48 contacting these exposed via portions, second dielectric layer 50 with openings extending to first metal level 48, second metal level 52 filling such openings and extending elsewhere as desired by the designer, third dielectric layer 54 having openings contacting second metal level 52, third metal level 56 filling such openings and providing, in this example, bonding pads on which solder bumps 58 may be formed. A more specific example by way of illustration and not intended to be limiting is provided at the left of FIG. 8, wherein dielectric layer 46 has an opening above portion 3240 of conductive material 32 in via cavity 294. Portion 481 of first metal level 48 fills this opening and extends elsewhere on first dielectric layer 46. Second dielectric layer 50 overlies first metal level portion 481 and has an opening extending thereto. Portion 521 of second metal level 52 fills this opening and extends over second dielectric layer 50. Third dielectric layer 54 covers second metal level portion 521 and has an opening extending thereto. Portion 561 of third metal level 56 fills this opening and provides bonding pad 561 that can be used, for example, for forming solder bump 581. In further embodiments, additional dielectric and metal levels and other external attachment means well known in the art can also be used. Structure 208 results.

Figure 9:
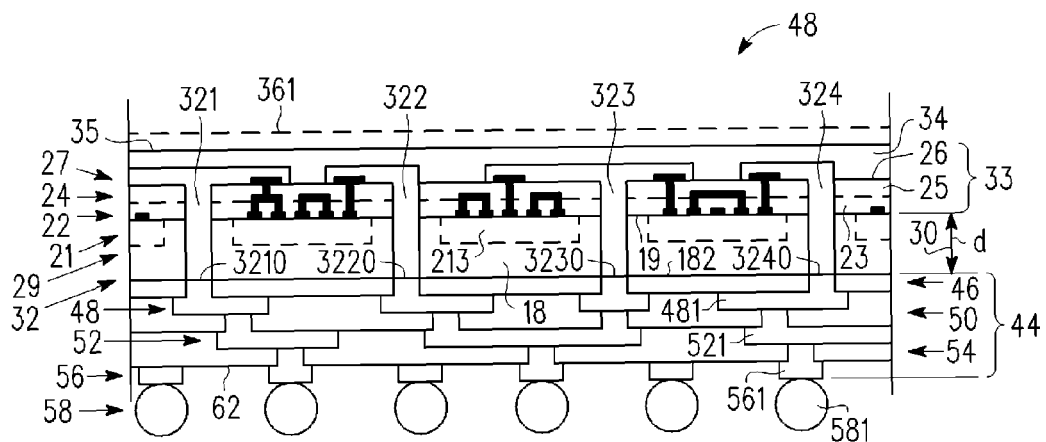

Referring now to manufacturing stage 109 of FIG. 9, support structure 40 is removed by, for example, softening or dissolving binding layer or adhesive 36 (or the sticky tape if that is being sued). When glass is used for support structure 40, infra-red light transmitted though glass support structure 40 can be used to thermally soften binding layer or adhesive 36, permitting support structure 40 to be lifted away from surface 35 of interconnect region 33 of thinned substrate 18. Any remaining portions 361 of adhesive or binding layer 36 may then be dissolved or pealed away from surface 35 of interconnect region 33 so that substantially completed assembly 48 is free standing as shown by structure 209. Thinned substrate 18 may be singulated to release the desired individual devices or ICs before or after manufacturing stage 109. For convenience of explanation it is assumed herein that assembly 48 shown by structure 209 is part of a desired IC, many of which have been formed via batch processing at the same time on the same substrate, e.g., substrate 18', 18.

Figure 10:
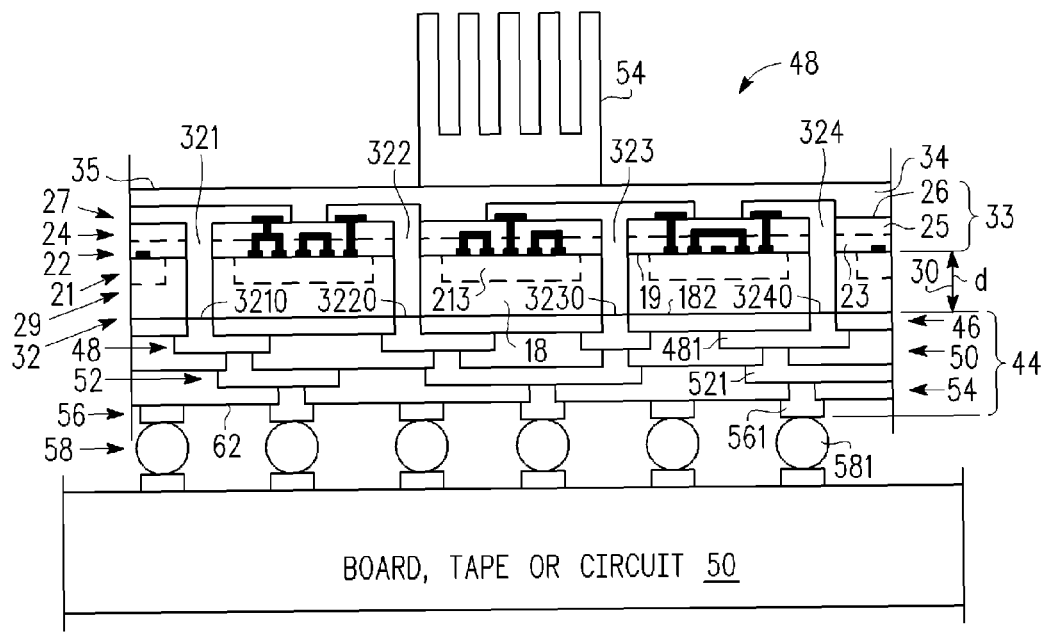

Referring now to manufacturing stage 110 of FIG. 10, assembly 48 is attached to circuit board or tape or larger circuit 50 by means of solder bumps 58 present in this example on assembly 48 or by whatever other bonding means is desired. Since during this attachment operation in manufacturing stage 110, assemblies 48 are being handled individually after singulation rather than in wafer form, the risk of breakage due to the very thin nature of substrate 18, whose thickness 30 (other than the interconnection regions 33, 44) is approximately equal to depth 30' of etched vias 29, wherein, unless substrate 18', 18 has been substantially over-thinned, d~d'. FIG. 10 also illustrates, for example, how heat removal from, for example, device region 213 can be improved by the invented structure, since heat sink 54 can be mounted on interconnect region 33 directly above and in close proximity to device region 213. Since even with multiple layers in interconnect region 33, their overall thickness is often smaller than thickness 30 of thinned wafer 18, lower thermal impedance can be obtained.

It will be appreciated that the invented structure and method permit much thinner final substrates 18 than could otherwise be safely handled by themselves and that can include any desired number of interconnect levels in interconnect region 33 on its front or primary face 19 and any desired number of interconnect levels on its back-side or rear face 182 using back-side interconnect region 44, any and all of which can be coupled to narrow high aspect ratio via cavities 29 filled with conductive material 32 and extending through thickness 30 (depth d) of substrate 18, which has been thinned in a manner that preserves its mechanical integrity during manufacture. Back-side, interconnect region 44 having one or more metal levels is formed on newly exposed rear face 182 of substrate 18 where narrow high aspect ratio vias cavities 29 filled with conductive material 32 are exposed and available, and, because of support structure 40, without significant risk of substrate breakage from mechanical handling during manufacturing. Further, when final substrate 18 is very thin, back-side interconnect region 44 can add significant additional mechanical strength to facilitate handling assemblies 48 after singulation. For example, and not intended to be limiting, front side AD region 21 in many cases is only 5-7 micrometers thick, so that the remaining portion of substrate 18 between AD region 21 and rear face 182 is electrically inactive. Under these circumstances, final thickness 30 of substrate or wafer 18 can be made as small as 12 to 20 micrometers. In this situation in order to avoid having assemblies 48 be excessively fragile after singulation, advantage is taken of the mechanical strength that can be added to substrate 18 by back-side interconnect region 44. For example, a four layer interconnect region can add 5-7 micrometers of additional material to surface 182 of substrate 18. Further interconnect layers can easily add 10 micrometers thickness to substrate 18. Thus, when substrate 18 is desired to be very thin (e.g., 10-20 micrometers or less), back-side interconnect region 44 can comprise approximately 30% to 50% or more of the total thickness of assembly 48, thus greatly increasing the mechanical strength and robustness of assemblies 48 after singulation when they are to be mounted on board, tape or circuit 50. Stated another way, it is useful that thickness 30 of final substrate 18 be less than 20% of thickness 20 of initial substrate or wafer 18' (i.e., 80% or more of initial thickness 20 of substrate 18' has been removed), more generally be less than about 10%, and preferably less than about 5% of thickness 20 of initial substrate or wafer 18'. Such thicknesses are made possible by the above-described method and structure. This is a substantial advance over the prior art. It will also be appreciate based on the explanation herein, that vias cavities 29 filled with high thermal conductivity material 32 can be used to provide more efficient heat extraction from device regions 21 by providing high thermal conductivity paths from the front side (19, 35) of assembly 48 where regions 21 are located to the back side (182, 62) of assembly 48 where a heat sink (not shown) can also be attached. Thus, the connections included in interconnect regions 33 and/or 44 may serve thermal as well as electrical purposes. This is especially valuable when substrate 18 is very thin and it is desired to extract heat from the rear rather than the front face of assemblies 48.

According to a first embodiment, there is provided a method for forming through-substrate conductor filled vias (321, 322, 323, 324, etc.) for back-side electrical or thermal interconnections (44) or both on a thinned substrate (18), comprising, providing (101) desired device regions (21) with contacts (22) on a front surface (19) of an initial substrate (18') having a back side (181), forming (104) via cavities (29) to depth d' from the front surface (19) partly through the initial substrate (18) in desired locations, filling (105) the via cavities (29) with a conductive material (32) coupled to some device region contacts (22), mounting (106) the initial substrate (18') with its front surface (19) coupled to a support structure (40), thinning (107) the initial substrate (18') from the back side (181) to provide a final substrate (18) that is thinner than the initial substrate (18') and on whose back surface (182) are exposed internal ends (3210, 3220, 3230, 3240, etc.) of the conductive material filled vias (321, 322, 323, 324, etc.), applying (108) any desired back-side interconnect region (44) coupled to the one or more exposed ends (3210, 3220, 3230, 3240, etc.) of the conductive material filled vias (321, 322, 323, 324, etc.), and removing (109) the support structure (40) and separating individual device or IC assemblies (48) of the final substrate (18) so as to be available for mounting (110) on a further circuit board, tape or larger circuit (50). According to a further embodiment, the method further comprises prior to the filling step (105), providing one or more refractory liners in the via cavities (29). According to a still further embodiment, the one or more refractory liners comprise a dielectric liner. According to a yet further embodiment, the one or more refractory liners comprise a barrier layer for inhibiting diffusion of the conductive material (32) into the final substrate (18). According to a still yet further embodiment, the one or more refractory liners comprise an adhesion layer for attachment of the conductive material (32) to the final substrate (18) in the via cavities (29). According to a yet still further embodiment, the via cavities (29) have a width w and the one or more refractory liners have a thickness less than about 20% of w. According to another embodiment, the final substrate (18) has a thickness (30) of about 20 micrometers or less and the back-side interconnect region (44) has a thickness of at least about 30% to 50% of the final substrate thickness (30). According to a still another embodiment, the initial substrate (18') has a first thickness (20) and the final substrate (18) has a second thickness (30) and the second thickness (30) is less than or equal about 20% of the first thickness (20). According to a yet another embodiment, the initial substrate (18') has a first thickness (20) and the final substrate (18) has a second thickness (30) and the second thickness (30) is less than or equal about 10% of the first thickness (20). According to a still yet another embodiment, the initial substrate (18') has a first thickness (20) and the final substrate (18) has a second thickness (30) and the second thickness (30) is less than or equal about 5% of the first thickness (20).

According to a second embodiment, there is provided a an electronic assembly (48) formed by a process, comprising, providing (101-103) an initial substrate (18') having an active device region (21) proximate a first surface (19) thereof, forming (104) via cavities (29) extending part-way through the initial substrate (18') from the first surface (19), filling (105) the via cavities (29) with a conductive material (32) at least partly coupled to some part of the active device region (21), mounting (106) the initial substrate (18') on a temporary support structure (40) with the first surface (19) facing the temporary support structure (40) and a rear face (181) of the initial substrate (18') exposed, removing (107) material from the rear face (181) until a new surface (182) is reached of a thinned substrate (18) on which interior ends (3210, 3220, 3230, 3240, etc.) of the via cavities (29) filled with the conductive material (32) are exposed, providing (108) a further interconnect region (44) on the new surface (182) making contact to at least some of the interior ends (3210, 3220, 3230, 3240, etc.) of the via cavities (29) filled with the conductive material (32), and removing (109) the temporary substrate (40). According to a further embodiment, the thinned substrate (18) has a thickness (30) less than or equal to about 20% of a thickness (20) of the initial substrate (18'). According to a still further embodiment, the via cavities (29) have a refractory liner. According to a yet further embodiment, the refractory liner comprises one or more of an insulating material, a barrier material, or an adhesion material. According to a still yet further embodiment, the further interconnect region (44) has a thickness of 30% to 50% of the thickness (30) of the thinned substrate (18).

According to a third embodiment, there is provided a method for forming electronic assemblies (48), comprising, providing (101-103) an initial semiconductor substrate (18') of a first thickness (20) and having a region (21) of active devices proximate a first surface (19) thereof, forming (104) via cavities (29) extending part-way through the initial semiconductor substrate (18') from the first surface (19), filling (105) the via cavities (29) with a conductive metal (32) coupled to some of the active devices, mounting (106) the initial semiconductor substrate (18') on a temporary support structure (40) with the first surface (19) facing the temporary support structure (40) and a rear face (181) of the initial semiconductor substrate (18') exposed, removing (107) material from the rear face (181) until a new surface (182) is reached on which interior ends (3210, 3220, 3230, 3240, etc.) of the metal filled via cavities (29) are exposed, thereby forming a thinned semiconductor substrate (18) of a second thickness (30) and still having the region (21) active devices proximate the first surface (19), providing (108) a further interconnect region (44) on the new surface (182) making contact to some or all of the interior ends (3210, 3220, 3230, 3240, etc.) of the via cavities (29) filled with the conductive metal (32, and removing (109) the temporary substrate (40). According to a further embodiment, the method further comprises during or after the providing step (101-103), forming (101-103) one or more interconnect levels on the first surface (19) coupling some of the active devices to each other or to locations that can be contacted by part of the conductive metal (32) during the filling step (105) or both. According to a still further embodiment, the removing step (107) removes at least 80% of the first thickness (20). According to a yet further embodiment, the further interconnect region (44) has a third thickness at least equal to 30% to 50% of the second thickness. According to a still yet further embodiment, the removing step (107) comprises chemical-mechanical-polishing.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An electronic assembly formed by a process, comprising:
    providing an initial substrate having an active device region proximate a first surface thereof;
    forming via cavities extending part-way through the initial substrate from the first surface;
    filling the via cavities with a conductive material at least partly coupled to some part of the active device region;
    mounting the initial substrate on a temporary support structure with the first surface facing the temporary support structure and a rear face of the initial substrate exposed;
    removing material from the rear face until a new surface of the initial substrate is exposed, resulting in a thinned substrate, wherein interior ends of the via cavities filled with the conductive material are exposed at the new surface;
    providing a further interconnect region on the new surface making contact to at least some of the interior ends of the via cavities filled with the conductive material; and
    removing the temporary support structure.

2. The device of claim 1, wherein the thinned substrate has a thickness less than or equal to about 20% of a thickness of the initial substrate.

3. The device of claim 1, wherein the via cavities have a refractory liner.

4. The device of claim 3, wherein the refractory liner comprises one or more of an insulating material, a barrier material, or an adhesion material.

5. The device of claim 1, wherein the further interconnect region has a thickness of 30% to 50% of the thickness of the thinned substrate.

6. A method for forming electronic assemblies, comprising:
    providing an initial semiconductor substrate of a first thickness and having a region of active devices proximate a first surface thereof;
    forming via cavities extending part-way through the initial semiconductor substrate from the first surface;
    filling the via cavities with a conductive metal coupled to some of the active devices;
    mounting the initial semiconductor substrate on a temporary support structure with the first surface facing the temporary support structure and a rear face of the initial semiconductor substrate exposed;
    removing material from the rear face until a new surface of the initial semiconductor substrate is exposed, wherein interior ends of the metal filled via cavities are exposed at the new surface, and wherein removing the material from the rear face results in a thinned semiconductor substrate of a second thickness and still having the region of active devices proximate the first surface;
    providing a further interconnect region on the new surface making contact to some or all of the interior ends of the via cavities filled with the conductive metal; and
    removing the temporary support structure.

7. The method of claim 6, further comprising, during or after the providing the initial semiconductor substrate step, forming one or more interconnect levels on the first surface coupling some of the active devices to each other or to locations that can be contacted by part of the conductive metal during the filling step or both.

8. The method of claim 6, wherein the removing material step removes at least 80% of the first thickness.

9. The method of claim 6, wherein the further interconnect region has a third thickness at least equal to 30% to 50% of the second thickness.

10. The method of claim 6, wherein the removing material step comprises chemical-mechanical-polishing.

* * * * *